(12) United States Patent
Tseng et al.

(10) Patent No.: US 8,424,202 B2
(45) Date of Patent: Apr. 23, 2013

(54) PROCESS FOR FABRICATING A CIRCUIT BOARD

(75) Inventors: Tzyy-Jang Tseng, Hsinchu (TW); Shu-Sheng Chiang, Taipei (TW); Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 255 days.

(21) Appl. No.: 12/783,851

(22) Filed: May 20, 2010

(65) Prior Publication Data
US 2011/0155441 A1  Jun. 30, 2011

(30) Foreign Application Priority Data
Dec. 31, 2009 (TW) ............................... 98146203 A

(51) Int. Cl.
*H01K 3/10* (2006.01)
(52) U.S. Cl.
USPC ............... 29/852; 29/830; 174/256; 216/65
(58) Field of Classification Search .............. 29/830, 29/846, 847, 852; 174/256, 262; 216/49, 216/65; 427/97.2; 438/640, 669
See application file for complete search history.

(56) References Cited

U.S. PATENT DOCUMENTS

| | | | | |
|---|---|---|---|---|
| 5,196,376 A | * | 3/1993 | Reche | ............................. 216/49 |
| 6,930,257 B1 | | 8/2005 | Hiner et al. | |
| 6,967,124 B1 | | 11/2005 | Huemoeller et al. | |
| 8,132,321 B2 | * | 3/2012 | Liu et al. | ........................ 29/830 |
| 2011/0147056 A1 | * | 6/2011 | Tseng et al. | .................. 174/256 |

FOREIGN PATENT DOCUMENTS

| TW | 200805611 | 1/2008 |
|---|---|---|
| TW | 200952131 | 12/2009 |

OTHER PUBLICATIONS

"Office Action of Taiwan Counterpart Application", issued on Sep. 14, 2012, p. 1-p. 5.

* cited by examiner

*Primary Examiner* — Donghai D. Nguyen
(74) *Attorney, Agent, or Firm* — J.C. Patents

(57) ABSTRACT

A process for fabricating a circuit board is provided. A circuit substrate having a first surface and a first circuit layer is provided. A first dielectric layer having a second surface is formed on the circuit substrate and covers the first surface and the first circuit layer. An antagonistic activation layer is formed on the second surface. The antagonistic activation layer is irradiated by a laser beam to form at least a blind via extended from the antagonistic activation layer to the first circuit layer and an intaglio pattern. A first conductive layer is formed inside the blind via. A second conductive layer is formed in the intaglio pattern and the blind via. The second conductive layer covers the first conductive layer and is electrically connected with the first circuit layer through the first conductive layer. The antagonistic activation layer is removed to expose the second surface.

13 Claims, 6 Drawing Sheets

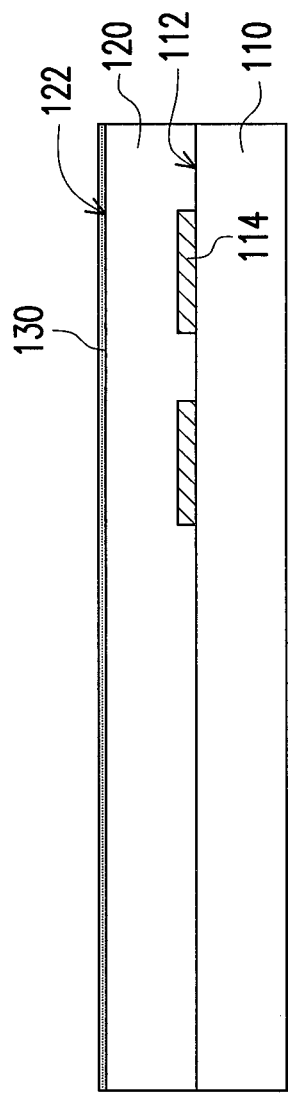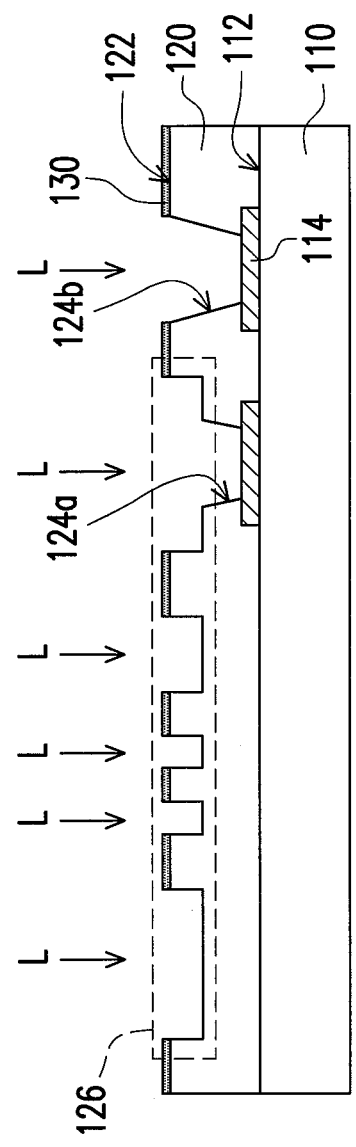

PROCESS FOR FABRICATING A CIRCUIT BOARD

CROSS-REFERENCE TO RELATED APPLICATION

This application claims the priority benefit of Taiwan application serial no. 98146203, filed on Dec. 31, 2009. The entirety of the above-mentioned patent application is hereby incorporated by reference herein and made a part of this specification.

BACKGROUND OF INVENTION

1. Field of Invention

The invention relates to a circuit board and a process for fabricating the same. More particularly, the invention relates to a circuit board having favorable reliability and a process for fabricating the same.

2. Description of Related Art

According to the current technologies, an embedded circuit board has been evolved from a common non-embedded circuit board. In particular, the common non-embedded circuit board is characterized in that circuits therein protrude from a surface of a dielectric layer. By contrast, circuits of the embedded circuit board are buried in the dielectric layer. Currently, a circuit structure of the circuit board is formed by performing a photolithography and etching process or a laser ablating process.

The fabricating process for forming build-up wiring structure of the embedded circuit board fabricated with the use of the laser ablating process comprises the following steps. A dielectric layer is formed on a circuit board having a circuit layer. Then, the surface of the dielectric layer is illuminated by a laser beam to form an intaglio pattern and a blind via connecting to the circuit layer. Thereafter, an electroplating process is performed to form a conductive layer filling up the blind via and the intaglio pattern. Herein, the build-up wiring structure of the embedded circuit board is roughly formed so far.

Since the depth of the blind via is different from the depth of the intaglio, the electroplating condition is not easy to be controlled when the electroplating process is performed, which leads to poor uniformity of the thickness of the conductive layer. Therefore, when a process for removing a portion of the conductive layer at the outside of the intaglio and the blind via is later performed, it is hard to control the thickness of the removed portion of the conductive layer. Hence, it is easy to improperly thinning the conductive layer of the embedded circuit board or leaving the conductive residue on the dielectric layer. Moreover, when the build-up wiring structure is fabricated on the aforementioned dielectric layer, the quality of the electroplating process is poor and the yield of the electroplating process is low. Therefore, the fabrication yield of the build-up wiring structure is decreased and the reliability of the circuit board is decreased as well.

SUMMARY OF INVENTION

The invention is directed to a circuit board and a process for fabricating the same in order to improve reliability of the circuit board.

In this invention, a process for fabricating a circuit board is further provided. In the process, a circuit substrate is provided. The circuit substrate has a first surface and a first circuit layer. A first dielectric layer is formed on the circuit substrate. The first dielectric layer has a second surface and covers the first surface and the first circuit layer. An antagonistic activation layer is formed on the second surface of the first dielectric layer. The antagonistic activation layer is irradiated by a laser beam to form an intaglio pattern and at least a blind via extending from the antagonistic activation layer to the first circuit layer. A first conductive layer is formed in the blind via. A second conductive layer is formed in the intaglio pattern and the blind via. The second conductive layer covers the first conductive layer and electrically connects the first circuit layer via the first conductive layer. The antagonistic activation layer is removed to expose the second surface of the first dielectric layer.

According to an embodiment of the invention, the step for forming the antagonistic activation layer comprises adhering a resin film having a capability of image transferring.

According to an embodiment of the invention, a thickness of the antagonistic activation layer ranges from 1 μm to 15 μm.

According to an embodiment of the invention, a material of the antagonistic activation layer includes a polymer material without having hydroxyl group or carboxyl group.

According to an embodiment of the invention, the polymer material is selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof.

According to an embodiment of the invention, the step of forming the antagonistic activation layer includes spray coating a nano-scale antagonistic activation material.

According to an embodiment of the invention, a thickness of the antagonistic activation layer ranges from 1 μm to 15 μm.

According to an embodiment of the invention, the laser beam includes an infrared laser source or an ultraviolet laser source.

According to an embodiment of the invention, a method of forming the first conductive layer in the blind via includes chemical deposition.

According to an embodiment of the invention, a height of the blind via is denoted as H and a thickness of the first conductive layer is denoted as h, and a relationship between h and H complies with $0.2 \leqq (h/H) \leqq 0.9$.

According to an embodiment of the invention, before the second conductive layer is formed, the process for fabricating the circuit board further includes forming an activation layer in the intaglio pattern of the first dielectric layer and on the first conductive layer.

According to an embodiment of the invention, a method of forming the second conductive layer in the blind via and the intaglio pattern includes chemical deposition.

According to an embodiment of the invention, a method of removing the antagonistic activation layer includes lifting or chemical etching.

According to an embodiment of the invention, the first circuit layer is embedded into the circuit substrate, and a surface of the first circuit layer and the first surface of the circuit substrate are substantially aligned.

According to an embodiment of the invention, the first circuit layer is disposed on the first surface of the circuit substrate.

According to an embodiment of the invention, the intaglio pattern and the blind via are connected.

According to an embodiment of the invention, after the antagonistic activation layer is formed to expose the second surface of the dielectric layer, the process for fabricating the circuit board further comprises forming a second dielectric layer on the first dielectric layer, wherein the second dielectric layer covers the second conductive layer and the second surface of the first dielectric layer.

According to an embodiment of the invention, the materials of the first dielectric layer and the second dielectric layer are the same.

According to an embodiment of the invention, the materials of the first dielectric layer and the second dielectric layer are different from each other.

In the invention, a circuit board including a circuit substrate, a first dielectric layer, a first conductive layer, a second conductive layer and a second dielectric layer is provided. The circuit substrate has a first surface and a first circuit layer. The first dielectric layer is disposed on the circuit substrate and covers the first surface and the first circuit layer. The first dielectric layer has a second surface, at least a blind via extending from the second surface to the first circuit layer, and an intaglio pattern. The first conductive layer is disposed in the blind via. The second conductive layer is disposed in the intaglio pattern and the blind via. Besides, the second conductive layer covers the first conductive layer. The second conductive layer is electrically connected to the first circuit layer via the first conductive layer. The second dielectric layer is disposed on the first dielectric layer and covers the second conductive layer and the second surface of the first dielectric layer.

According to an embodiment of the invention, a height of the blind via is denoted as H and a thickness of the first conductive layer is denoted as h, and a relationship between h and H complies with $0.2 \leq (h/H) \leq 0.9$.

According to an embodiment of the invention, the intaglio pattern and the blind via are connected.

According to an embodiment of the invention, the circuit board further includes an activation layer disposed between the intaglio pattern of the first dielectric layer and the second conductive layer and between the first conductive layer and the second conductive layer.

According to an embodiment of the invention, the first circuit layer is embedded into the circuit substrate, and a surface of the first circuit layer and the first surface on the circuit substrate are substantially aligned.

According to an embodiment of the invention, the first circuit layer is disposed on the first surface of the circuit substrate.

According to an embodiment of the invention, the materials of the first dielectric layer and the second dielectric layer are the same.

According to an embodiment of the invention, the materials of the first dielectric layer and the second dielectric layer are different from each other.

Based on the above, in the process for fabricating the circuit board, the first conductive layer is formed in the blind via to reduce height difference between the blind via and the intaglio pattern, and the second conductive layer is then formed in the intaglio pattern and on the first conductive layer in the blind via according to the invention. Thereby, the conductive layer formed in the blind via and the intaglio pattern can have uniform thickness and favorable surface flatness. In addition, the antagonistic activation layer is employed in the circuit board of the invention to restrict a position where the second conductive layer is deposited, thus preventing excessive deposition of the second conductive layer. As such, the conventional problems of unfavorable uniformity of the conductive layer and insufficient or excessive void-free filling by electroplating can be avoided by applying the circuit board and the process for fabricating the same according to the invention, and the reliability of the circuit board can be improved as well.

It is to be understood that both the foregoing general descriptions and the detailed embodiments are exemplary and are, together with the accompanying drawings, intended to provide further explanation of technical features and advantages of the invention.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A to 2G are schematic cross-sectional views illustrating a process for fabricating a circuit board according to an embodiment of the invention.

DESCRIPTION OF EMBODIMENTS

Figure 1A:
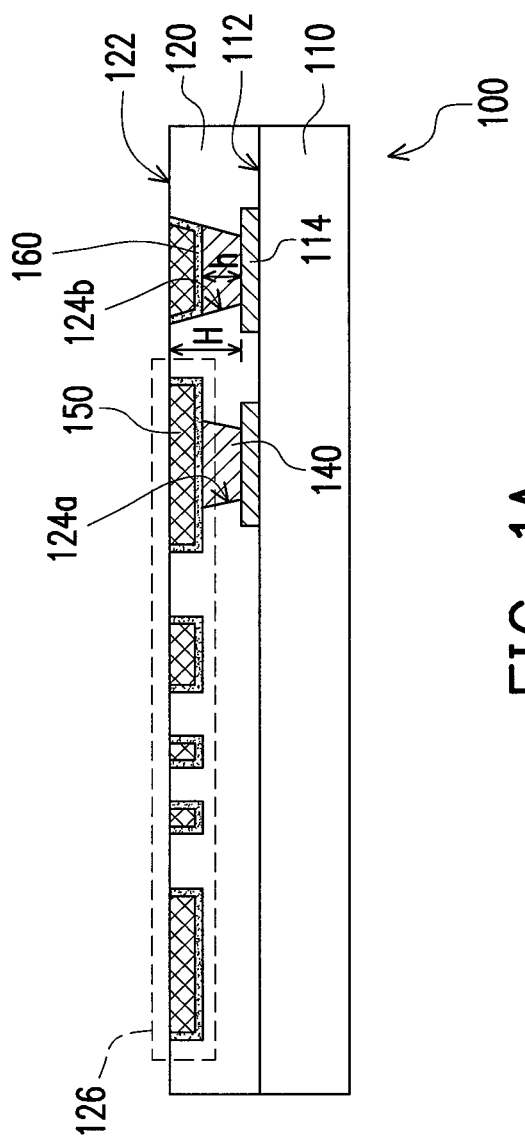
FIG. 1A is a schematic cross-sectional view illustrating a circuit board according to an embodiment of the invention.

FIG. 1A is a schematic cross-sectional view illustrating a circuit board according to an embodiment of the invention. As indicated in FIG. 1A, a circuit board 100 includes a circuit substrate 110, a dielectric layer 120, a first conductive layer 140, and a second conductive layer 150. It should be mentioned that the circuit board 100 can have a single circuit layer or multiple circuit layers. That is to say, the circuit board 100 can be a single layer circuit board, a double layer circuit board, or a multi-layer circuit board. In this embodiment, the circuit board 100 depicted in FIG. 1A is a build-up wiring board.

To be more specific, the circuit substrate 110 has a first surface 112 and a first circuit layer 114. The first circuit layer 114 is disposed on the first surface 112 of the circuit substrate 110. In other words, the first circuit layer 114 is a normal circuit layer (i.e. a non-embedded circuit layer). Note that the first circuit layer 114 is disposed on the first surface 112 of the circuit substrate 110 according to the embodiment depicted in FIG. 1A. However, in other embodiments that are not illustrated in the drawings, the first circuit layer 114 can also be embedded into the circuit substrate 110, and a surface of the first circuit layer 114 and the first surface 112 on the circuit substrate 110 are substantially aligned. Namely, the first circuit layer 114 is basically an embedded circuit layer in other embodiments. The structure of the circuit substrate 110 depicted in FIG. 1A is merely exemplary, which should not be construed as limited to the embodiments of the invention set forth herein.

The dielectric layer 120 is disposed on the circuit substrate 110 and covers the first surface 112 and the first circuit layer 114. In this embodiment, the dielectric layer 120 has a second surface 122, at least a blind via (two blind vias 124a and 124b are schematically shown in FIG. 1A) extending from the second surface 122 to the first circuit layer 114, and an intaglio pattern 126. The blind via 124a and the intaglio pattern 126 are connected.

The first conductive layer 140 is disposed in the blind vias 124a and 124b. A height of the blind via 124a (or the blind via 124b) is denoted as H, and a thickness of the first conductive layer 140 is denoted as h. Preferably, the relationship between H and h complies with $0.2 \leqq (h/H) \leqq 0.9$. The second conductive layer 150 is disposed in the intaglio pattern 126 and the blind vias 124a and 124b. Additionally, the second conductive layer 150 covers the first conductive layer 140. Namely, the second conductive layer 150 is disposed in the intaglio pattern 126 and the blind vias 124a and 124b where the first conductive layer 140 is already disposed. Moreover, according to this embodiment, the second conductive layer 150 can electrically connect the first circuit layer 114 of the circuit substrate 110 via the first conductive layer 140.

The circuit board 100 of this embodiment further includes an activation layer 160 disposed between the intaglio pattern 126 of the dielectric layer 120 and the second conductive layer 150 and between the first conductive layer 140 and the second conductive layer 150. According to this embodiment, the activation layer 160 is used to generate the initiation of the chemical deposition reaction in order to benefit the formation of the second conductive layer 150 in the intaglio pattern 126 and on the first conductive layer 140. The material of the activation layer 160 can be, for example, palladium.

Since the first conductive layer 140 is disposed in the blind vias 124a and 124b of the dielectric layer 120 according to this embodiment, height difference between the blind vias 124a and 124b and the intaglio pattern 126 can be reduced. The more the value (h/H) approaches 1, the thicker the first conductive layer 140 is. Hence, the second conductive layer 150 in the blind vias 124a and 124b has a thickness gradually close to the thickness of the second conductive layer 150 to be disposed in the intaglio pattern 126. As such, when the second conductive layer 150 is disposed in the blind vias 124a and 124b and the intaglio pattern 126, uniform thickness and desired surface flatness can be achieved.

Figure 1B:
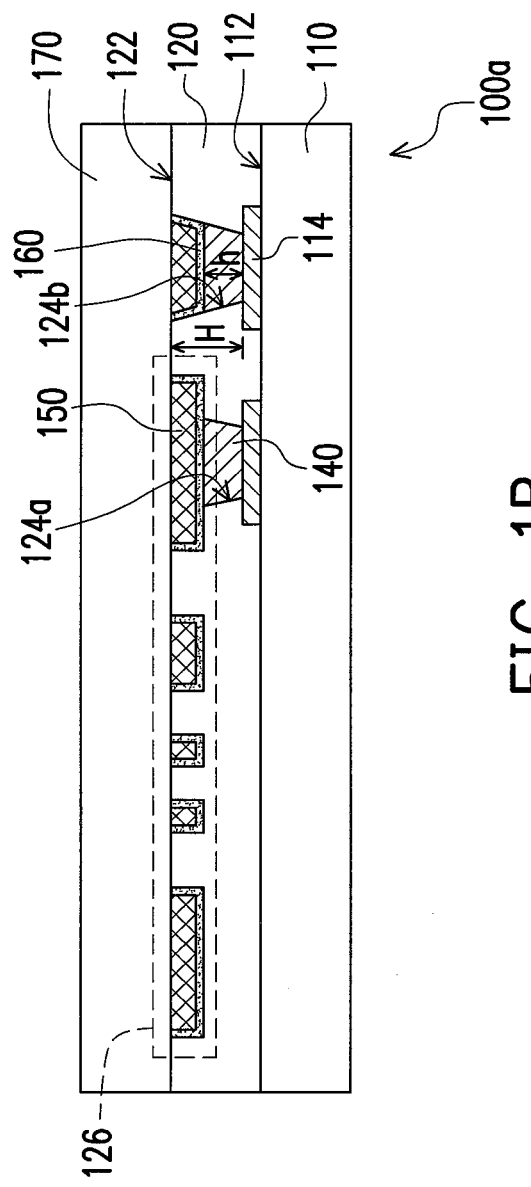
FIG. 1B is a schematic cross-sectional view illustrating a circuit board according to another embodiment of the invention.

It should be noticed that, in other embodiment, referring to FIG. 1B, the other one dielectric layer 170 can be formed on the dielectric layer 120. The dielectric layer 170 covers the second conductive layer and the second surface 122 of the dielectric layer 120. In addition, in this embodiment, the material of the dielectric layer 170 and the material of the dielectric layer 120 can be selected to be substantially equal to or different from each other according to different requirements for specific uses and are not limited herein.

Up to here, only the structure of the circuit board 100 of the invention is described, while a process for fabricating the circuit board 100 of the invention is not yet provided. The process for fabricating the circuit board 100 of the invention is elucidated hereinafter with reference to FIGS. 2A and 2G. Note that the circuit board 100 depicted in FIG. 1A serves as an exemplary circuit board herein.

Figure 2C:
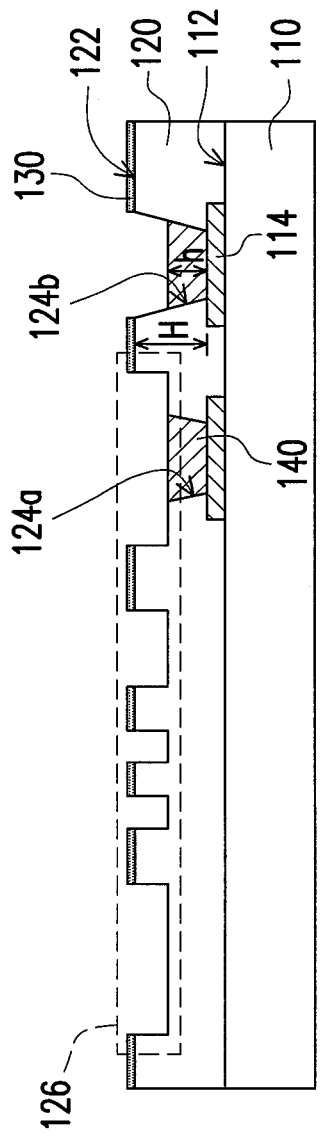

FIGS. 2A to 2G are schematic cross-sectional views illustrating a process for fabricating a circuit board according to an embodiment of the invention. As indicated in FIG. 2A, according to the process for fabricating the circuit board 100 in the embodiment, a circuit substrate 110 is provided. The circuit substrate 110 has a first surface 112 and a first circuit layer 114. The first circuit layer 114 is disposed on the first surface 112 of the circuit substrate 110. Namely, the first circuit layer 114 is basically a normal circuit layer (i.e. the non-embedded circuit layer). Note that the first circuit layer 114 can also be embedded into the circuit substrate 110, and a surface of the first circuit layer 114 and the first surface 112 on the circuit substrate 110 are substantially aligned in other embodiments that are not illustrated in the drawings. Namely, the first circuit layer 114 is basically an embedded circuit layer in other embodiments. The structure of the circuit substrate 110 depicted in FIG. 2A is merely exemplary, which should not be construed as limited to the embodiments of the invention set forth herein.

In FIG. 2A, a dielectric layer 120 is formed on the circuit substrate 110. The dielectric layer 120 has a second surface 122 and covers the first surface 112 and the first circuit layer 114.

As shown in FIG. 2A, an antagonistic activation layer 130 is formed on the second surface 122 of the dielectric layer 120. The antagonistic activation layer 130 serves to restrict a position where a subsequently-formed conductive layer is deposited. That is to say, the subsequently-formed conductive layer is merely deposited in a place where the antagonistic activation layer 130 is not formed. According to this embodiment, a method of forming the antagonistic activation layer 130 includes adhering a resin film having a capability of image transferring or spray coating a nano-scale antagonistic activation material. In other words, the antagonistic activation layer 130 can be formed and then attached to the second surface 122 of the dielectric layer 120. Alternatively, the antagonistic activation layer 130 can be formed on the dielectric layer 120 by spraying. Besides, a thickness of the antagonistic activation layer 130 preferably ranges from 1 μm to 15 μm. The material of the antagonistic activation layer 130 can be, for example, a polymer material without having hydroxyl group or carboxyl group. Further, the polymer material can be, for example, selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof.

In FIG. 2B, the antagonistic activation layer 130 is irradiated by a laser beam L to form an intaglio pattern 126 and at least a blind via (two blind vias 124a and 124b are schematically shown in FIG. 2B) extending from the antagonistic activation layer 130 to the first circuit layer 114. Here, the blind via 124a and the intaglio pattern 126 are connected. The laser beam L of this embodiment is a carbon dioxide laser source, for instance.

With reference to FIG. 2C, a first conductive layer 140 is formed in the blind vias 124a and 124b. Here, a method of forming the first conductive layer 140 in the blind vias 124a and 124b is, for example, chemical deposition. Particularly, in this embodiment, a height of the blind via 124a (or the blind via 124b) is denoted as H, and a thickness of the first conductive layer 140 is denoted as h. Preferably, the relationship between h and H complies with $0.2 \leqq (h/H) \leqq 0.9$.

Figure 2D:
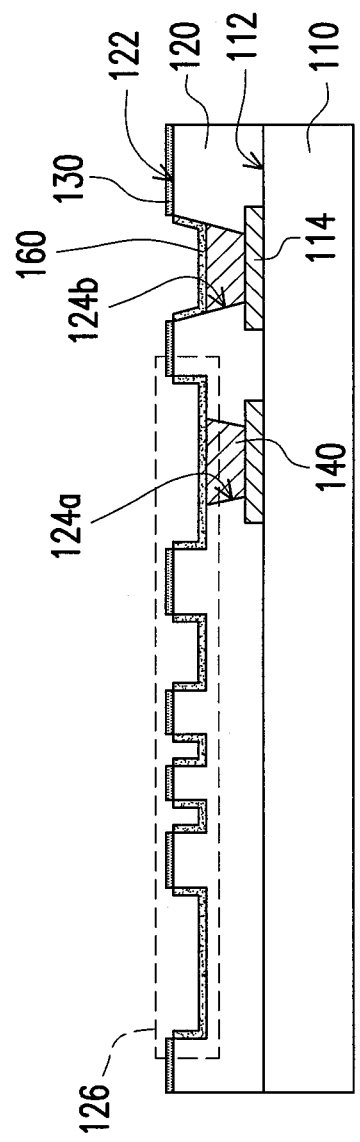

As shown in FIG. 2D, an activation layer 160 is formed in the intaglio pattern 126 of the dielectric layer 120 and on the first conductive layer 140 for generating an initiation of the chemical deposition reaction which benefits the formation of the second conductive layer 150 in the intaglio pattern 126 and on the first conductive layer 140 in the later process step. In the present embodiment, the material of the activation layer 160 can be, for example, palladium.

Figure 2E:
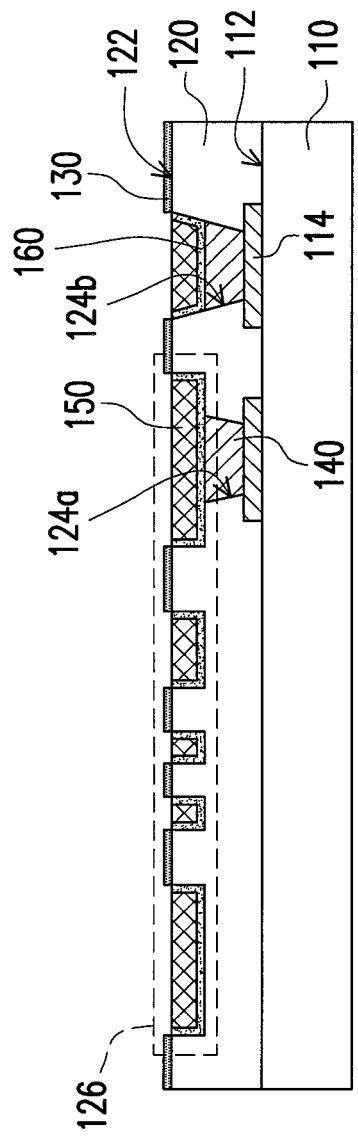

In FIG. 2E, the second conductive layer 150 is formed in the intaglio pattern 126 and the blind vias 124a and 124b. The second conductive layer 150 covers the first conductive layer 140 and electrically connects the first circuit layer 114 via the first conductive layer 140. In this embodiment, the second conductive layer 150 and the second surface 122 of the dielectric layer 120 are substantially aligned. Namely, the second conductive layer 150 does not cover the antagonistic activation layer 130. Here, a method of forming the second conductive layer 150 in the blind vias 124a and 124b and the intaglio pattern 126 is, for example, chemical deposition.

Figure 2F:
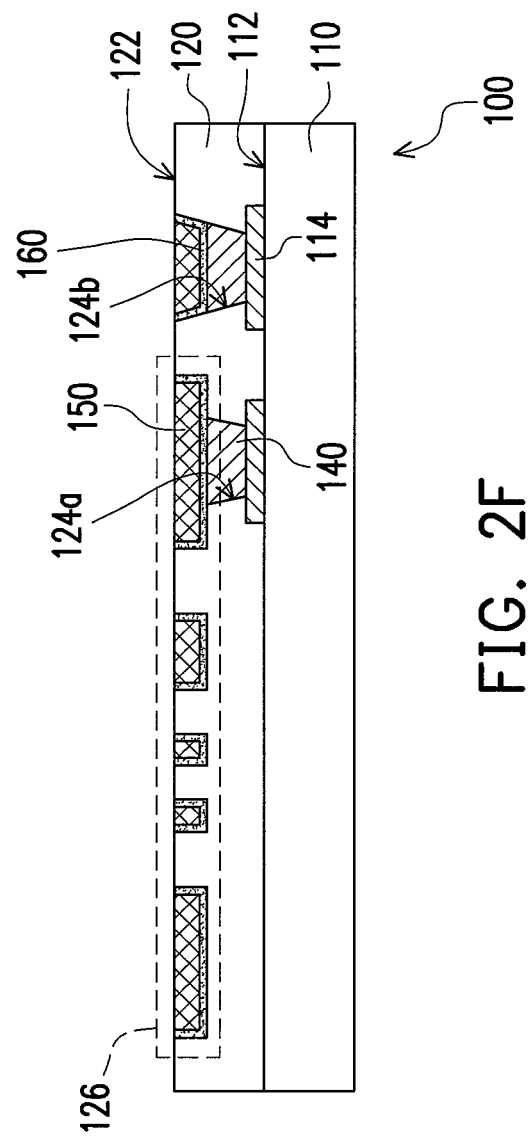

Finally, in FIG. 2F, after the second conductive layer 150 is formed, the antagonistic activation layer 130 is removed to expose the second surface 122 of the dielectric layer 120 and form the circuit board 100. Here, a method of removing the antagonistic activation layer 130 includes lifting or chemical etching. So far, the fabrication of the circuit board 100 is completed.

Figure 2G:
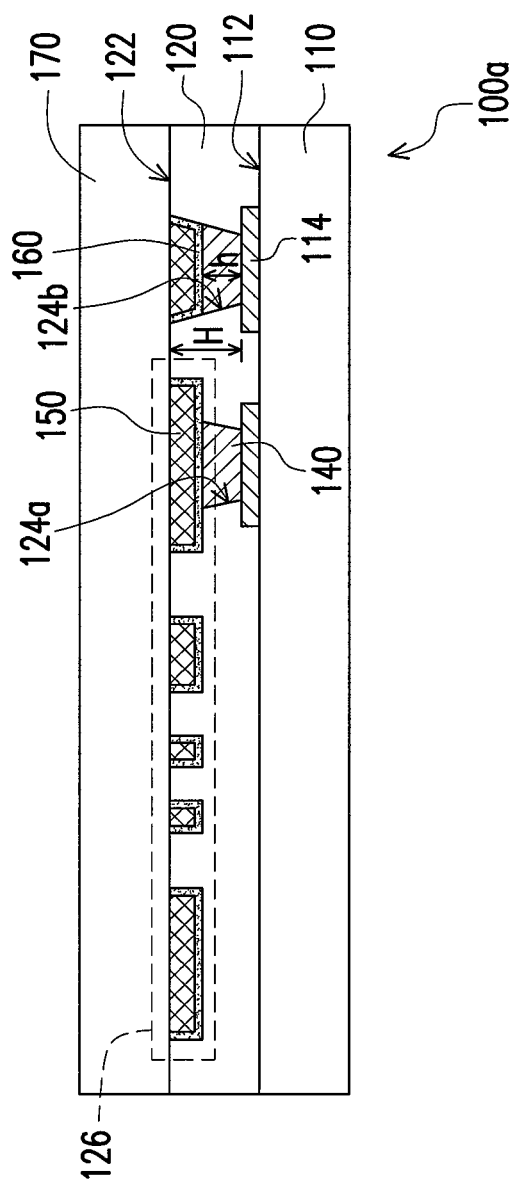

Certainly, after the antagonistic activation layer 130 is removed, referring to FIG. 2G, the other one dielectric layer 170 can be selected according to different requirements for specific use. Here, the dielectric layer 170 covers the second conductive layer 150 and the second surface 122 of the dielectric layer 120. Namely, by comparing with the circuit board 100 of the FIG. 1A, the circuit board 100a has two dielectric layers 120,170. In addition, the material of the dielectric layer 170 and the material of the dielectric layer 120 can be selected to be substantially equal to or different from each other according to different requirements for specific uses and are not limited herein.

According to the process for fabricating the circuit board 100 in this embodiment, the first conductive layer 140 is formed in the blind vias 124a and 124b to reduce height difference between the blind vias 124a and 124b and the intaglio pattern 126, and the second conductive layer 150 is then formed in the intaglio pattern 126 and on the first conductive layer 140 in the blind vias 124a and 124b. Thereby, the conductive layer formed in the blind vias 124a and 124b and the intaglio pattern 126 can have uniform thickness and favorable surface flatness. In addition, the antagonistic activation layer 130 is employed in the process for fabricating the circuit board 100 of this embodiment to restrict the position where the first conductive layer 140 and the second conductive layer 150 are deposited. As such, excessive deposition of the second conductive layer 150 can be prevented in an effective manner.

In light of the foregoing, according to the invention, the first conductive layer is formed in the blind via to reduce height difference between the blind via and the intaglio pattern, and the second conductive layer is then formed in the intaglio pattern and on the first conductive layer in the blind via. Thereby, the conductive layer formed in the blind via and the intaglio pattern can have uniform thickness and favorable surface flatness. In addition, the antagonistic activation layer is employed in the circuit board of the invention to restrict the position where the conductive layer is deposited, thus preventing excessive deposition of the second conductive layer. As such, the conventional problems of unfavorable uniformity of the conductive layer and insufficient or excessive void-free filling by electroplating can be avoided by applying the circuit board and the process for fabricating the same according to the invention, and the reliability of the circuit board can be improved as well.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A process for fabricating a circuit board, the process comprising:
   providing a circuit substrate having a first surface and a first circuit layer;
   forming a first dielectric layer on the circuit substrate, the first dielectric layer having a second surface and covering the first surface and the first circuit layer;
   forming an antagonistic activation layer on the second surface of the first dielectric layer;
   irradiating the antagonistic activation layer by a laser beam to form an intaglio pattern and at least a blind via extending from the antagonistic activation layer to the first circuit layer;
   forming a first conductive layer in the at least a blind via; and
   forming a second conductive layer in the intaglio pattern and the at least a blind via, the second conductive layer covering the first conductive layer and electrically connecting the first circuit layer via the first conductive layer; and
   removing the antagonistic activation layer to expose the second surface of the first dielectric layer.

2. The process as claimed in claim 1, wherein a method of forming the antagonistic activation layer comprises adhering a resin film having a capability of image transferring.

3. The process as claimed in claim 1, wherein a thickness of the antagonistic activation layer ranges from 1 μm to 15 μm.

4. The process as claimed in claim 1, wherein a material of the antagonistic activation layer comprises a polymer material without having hydroxyl group or carboxyl group.

5. The process as claimed in claim 1, wherein a method of forming the antagonistic activation layer comprises spray coating a nano-scale antagonistic activation material.

6. The process as claimed in claim 1, wherein a method of forming the first conductive layer in the at least a blind via comprises chemical deposition.

7. The process as claimed in claim 1, wherein a height of the at least a blind via is denoted as H and a thickness of the first conductive layer is denoted as h, and a relationship between h and H complies with $0.2 < (h/H) < 0.9$.

8. The process as claimed in claim 1, before forming the second conductive layer, further comprising:
   forming an activation layer in the intaglio pattern of the first dielectric layer and on the first conductive layer.

9. The process as claimed in claim 1, wherein a method of forming the second conductive layer in the at least a blind via and the intaglio pattern comprises chemical deposition.

10. The process as claimed in claim 1, wherein a method of removing the antagonistic activation layer comprises lifting or chemical etching.

11. The process as claimed in claim 1, wherein the first circuit layer is embedded into the circuit substrate, and a surface of the first circuit layer and the first surface are substantially aligned.

12. The process as claimed in claim 1, wherein the intaglio pattern and the at least a blind via are connected.

13. The process as claimed in claim 1, wherein after removing the antagonistic activation layer to expose the second surface of the dielectric layer, further comprising:
   forming a second dielectric layer on the first dielectric layer, wherein the second dielectric layer covers the second conductive layer and the second surface of the first dielectric layer.

* * * * *